United States Patent [19]

Scanlan

[11] Patent Number: 5,786,097
[45] Date of Patent: Jul. 28, 1998

[54] ASSEMBLY SUBSTRATE AND METHOD OF MAKING

[75] Inventor: Christopher M. Scanlan, Phoenix, Ariz.

[73] Assignee: Motorola, Inc., Schaumburg, Ill.

[21] Appl. No.: 595,565

[22] Filed: Feb. 1, 1996

[51] Int. Cl.$^6$ .................................. B32B 9/00
[52] U.S. Cl. ..................... 428/469; 428/209; 428/216; 428/336; 428/472; 428/610; 428/632; 428/633; 428/660; 428/635; 428/698; 428/701; 428/702; 427/249; 427/255; 427/255.3; 204/192.15; 204/192.16; 204/192.23
[58] Field of Search ........................... 428/209, 633, 428/627, 610, 660, 632, 635, 702, 698, 432, 469, 701, 216, 336, 472; 204/192.16, 192.26, 192.15, 192.23; 427/249, 255, 255.3

[56] References Cited

U.S. PATENT DOCUMENTS

| | | | |
|---|---|---|---|
| 4,532,190 | 7/1985 | Kanbe et al. | 428/627 |
| 4,904,542 | 2/1990 | Mroczkowski | 428/610 |
| 5,192,410 | 3/1993 | Ito et al. | 204/192.16 |
| 5,472,795 | 12/1995 | Atita | 428/660 |

OTHER PUBLICATIONS

Scanlan et al., Applied Physics Letter, "Tetragonal zirconia growth by nanolaminate formation", Jun. 27, 1994, vol. 64, No. 26, pp. 3548-3550.

*Primary Examiner*—William Krynski
*Assistant Examiner*—Abraham Bahta
*Attorney, Agent, or Firm*—George C. Chen

[57] ABSTRACT

An assembly substrate includes a substrate (11, 31, 41), a composite layer (12, 32, 42) overlying the substrate (11, 31, 41), and an electrically conductive layer (13, 33, 43) overlying the composite layer (12, 32, 42). The composite layer (12, 32, 42) includes a first material having an as-deposited tetragonal crystal structure and a second material. The second material in the composite layer (12, 32, 42) reduces the susceptibility of the composite layer (12, 32, 42) to fracture under stress.

20 Claims, 1 Drawing Sheet

ASSEMBLY SUBSTRATE AND METHOD OF MAKING

BACKGROUND OF THE INVENTION

This invention relates, in general, to semiconductors, and more particularly, to assembly substrates in semiconductor components.

Heat dissipation is an important consideration for high power and high current applications. Assembly substrates have been constructed to facilitate heat dissipation from semiconductor devices that are mounted onto the assembly substrates. Recently, assembly substrates have been made from aluminum nitride substrates, which have superior heat dissipation characteristics compared to conventionally used ceramic oxide substrates such as aluminum oxide.

A patterned copper film is directly bonded to the aluminum nitride substrate to provide electrical coupling to the semiconductor devices that are mounted over the patterned copper film. To ensure adequate adhesion between the aluminum nitride substrate and the copper film, the aluminum nitride substrate must first be oxidized. However, the thickness of the thin oxide film located between the aluminum nitride substrate and the copper film must be precisely controlled. Furthermore, the thin oxide film is brittle and easily fractures under temperature cycling, which causes reliability problems for the assembly substrate.

Accordingly, a need exists for an assembly substrate that efficiently dissipates heat through an aluminum nitride substrate. The method for making the assembly substrate should produce a reliable interface between the aluminum nitride substrate and an overlying copper film.

DETAILED DESCRIPTION OF THE DRAWINGS

Figure 1:
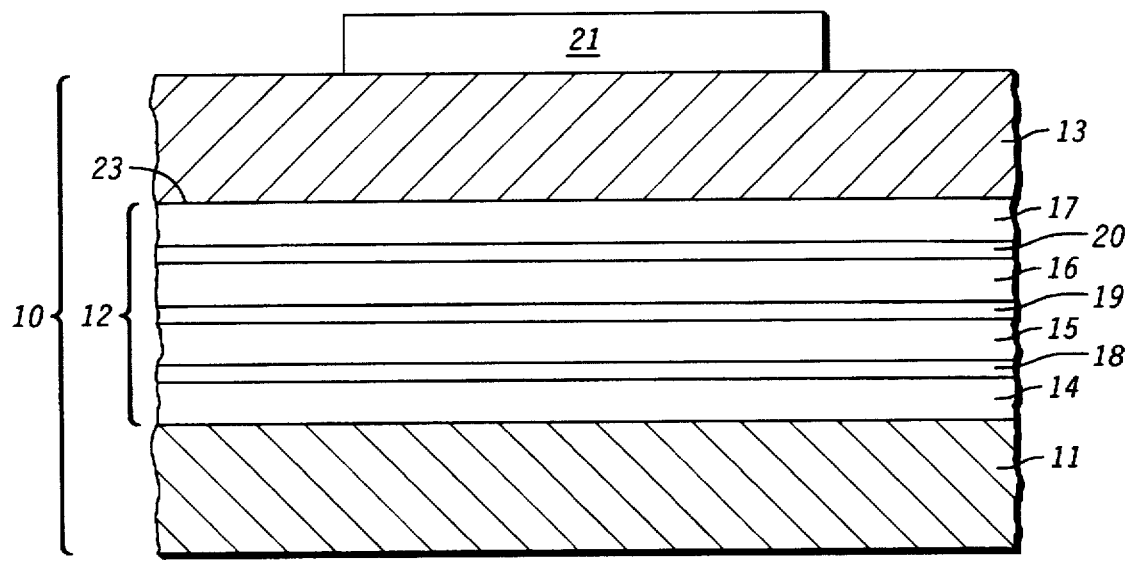
FIG. 1 illustrates a partial cross-sectional view of an embodiment of an assembly substrate in accordance with the present invention.

Turning to the figures for a more detailed description, FIG. 1 illustrates a partial cross-sectional view of an embodiment of an assembly substrate 10. Assembly substrate 10 includes a substrate 11, an electrically conductive layer 13, and a composite layer 12 located between substrate 11 and electrically conductive layer 13. Assembly substrate 10 can be a portion of a semiconductor component 22, which also includes a semiconductor device 21. It is understood that FIG. 1 portrays a simplified schematic view of semiconductor device 21, which overlies and is electrically coupled to electrically conductive layer 13 using wire bonding, flip chip, or other techniques known in the art.

Substrate 11 is comprised of aluminum nitride (AlN), which has superior heat conductivity compared to ceramic oxide materials including, but not limited to, aluminum oxide. Preferably, substrate 11 has a thickness of approximately 375–625 microns to provide an adequate amount of thermal mass for heat dissipation.

Electrically conductive layer 13 overlies substrate 11, is preferably patterned, and is comprised of an electrical conductor such as, for example, aluminum or, preferably, copper. In one embodiment, layer 13 has a thickness of approximately 175–425 microns so that as layer 13 provides electrical signals to semiconductor device 21, the current density in layer 13 is not too high.

Composite layer 12 overlies substrate 11, underlies layer 13, and is comprised of buffer layers 14, 15, 16, and 17 and transformation toughening layers 18, 19, and 20. Layers 18, 19, and 20 are located between layers 14, 15, 16, and 17, respectively. Layers 18, 19, and 20 form a transformation toughening structure that is resistant to crack formation and crack growth. Preferably, layers 18, 19, and 20 have an as-deposited tetragonal crystal structure to facilitate the transformation toughening of composite layer 12, which improves the reliability of assembly substrate 10 and semiconductor component 22 as discussed hereinafter.

In the prior art where only a thin oxide film separates an aluminum nitride substrate from an overlying copper film, the thin oxide film delaminates, cracks, or fractures when subjected to temperature gradients or temperature cycling due to stresses generated from mismatches in coefficients of thermal expansion (CTE) between the aluminum nitride substrate and the copper film.

When assembly substrate 10 is subjected to stress, composite layer 12 does not delaminate or crack as in the prior art. Instead, the tetragonal crystal structure of layers 18, 19, and 20 is transformed into a monoclinic crystal structure by the stress. This stress-induced transformation from a tetragonal crystal structure to a monoclinic crystal structure is known in the art as a martensitic transition. Therefore, when exposed to stresses such as those resulting from temperature variations, the as-deposited tetragonal crystal structure of layers 18, 19, and 20 prevents composite layer 12 from fracturing. Thus, layers 18, 19, and 20 improve the reliability of assembly substrate 10 and semiconductor component 22 over the prior art.

In one embodiment, layers 18, 19, and 20 are comprised of zirconia ($ZrO_2$), which is capable of forming the desired tetragonal crystal structure. In this embodiment, an oxide layer such as, for example, alumina ($Al_2O_3$) or silicon oxide (SiO, $SiO_2$, etc.) is located between layer 13 and layer 20. This particular oxide layer is identified as layer 17 in the embodiment illustrated in FIG. 1. Layer 17 is located between layer 13 and layer 20 because, when heated, layer 17 forms a high quality eutectic oxide bond 23 with layer 13 that has better adhesion compared to a zirconia-copper interface. Layer 17 should also have good adhesion to underlying layer 20.

Layers 15 and 16 of composite layer 12 serve as buffer layers between layers 18, 19, and 20. The materials used for layers 15 and 16 should have good adhesion to layers 18, 19, and 20 and should also have a sufficiently high modulus of elasticity to be able to provide elastic constraint when layers 18, 19, and 20 transform from one crystal structure to another. In one embodiment, layers 15 and 16 are comprised of an oxide such as, for example, alumina or silicon oxide. In another embodiment, layers 15 and 16 are comprised of silicon carbide (SiC) to improve the thermal conductivity of composite layer 12.

Layer 14 of composite layer 12 should provide good adhesion to overlying layer 18 and underlying substrate 11. Accordingly, layer 14 is preferably comprised of an oxide including, but not limited to, alumina or silicon oxide. To further increase the adhesion between composite layer 12 and underlying substrate 11, a titanium nitride layer (not shown) can be located between composite layer 12 and underlying substrate 11.

When layers 14, 15, 16, and 17 are comprised of an oxide, layers 14, 15, 16, and 17 have small thermal conductivities compared to substrate 11 and layer 13. Therefore, layers 14, 15, 16, and 17 preferably each have a small thickness of approximately 10-100 nanometers (nm) so that the overall thermal conductivity of assembly substrate 10 is not significantly degraded.

Layers 14, 15, 16, 17, 18, 19, and 20 of composite layer 12 are sequentially provided or disposed over substrate 11 preferably using a sputtering technique or a vapor deposition technique. For example, the individual layers of composite layer 12 can be deposited using a radio frequency (rf) reactive sputtering tool that has a zirconium (Zr) sputtering target, an aluminum (Al) sputtering target, and an oxygen ambient.

The technique used to deposit layers 18, 19, and 20 should be able to form the desired tetragonal crystal structure for layers 18, 19, and 20. When a sputtering or vapor deposition technique is used to deposit layers 18, 19, and 20, the tetragonal crystal structure is primarily dependent upon the individual thicknesses of layers 18, 19, and 20. Accordingly, when layers 18, 19, and 20 are comprised of zirconia and are kept below a thickness of approximately 13 nm, the desired tetragonal crystal structure will be formed during the sputtering or vapor deposition process. In one embodiment, layers 18, 19, and 20 are approximately 2-13 nm thick. Preferably, layers 18, 19, and 20 have a thickness of approximately 6 nm. Therefore, because the tetragonal crystal structure of layers 18, 19, and 20 is primarily dependent upon the individual thicknesses of the layers 18, 19, and 20, the process for forming layers 18, 19, and 20 is easily controllable and manufacturable.

Figure 2:
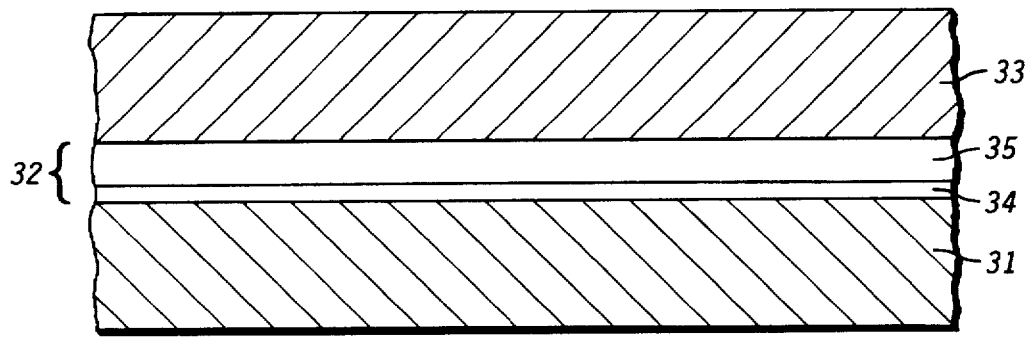
FIG. 2 portrays a partial cross-sectional view of another embodiment of an assembly substrate in accordance with the present invention.

Referring to the next figure, FIG. 2 portrays a partial cross-sectional view of another embodiment of an assembly substrate 30. Assembly substrate 30 has an aluminum nitride substrate 31 and an overlying copper layer 33, which are similar to substrate 11 and layer 13, respectively, of FIG. 1. Assembly substrate 30 also includes a composite layer 32, which is located between aluminum nitride substrate 31 and copper layer 33. Composite layer 32 includes zirconia layer 34 and alumina layer 35, which are similar to layers 20 and 17, respectively, of FIG. 1.

In the embodiment portrayed in FIG. 2, zirconia layer 34 directly contacts aluminum nitride substrate 31 as compared to the embodiment illustrated in FIG. 1 where a zirconia layer does not directly contact substrate 11. It is understood that while the embodiment portrayed in FIG. 2 can be easier to fabricate than the embodiment illustrated in FIG. 1 because composite layer 32 of FIG. 2 has fewer layers than composite layer 12 of FIG. 1, the embodiment of FIG. 1 provides a more robust toughening mechanism than the embodiment of FIG. 2 because composite layer 12 has more layers of zirconia than composite layer 32.

Figure 3:
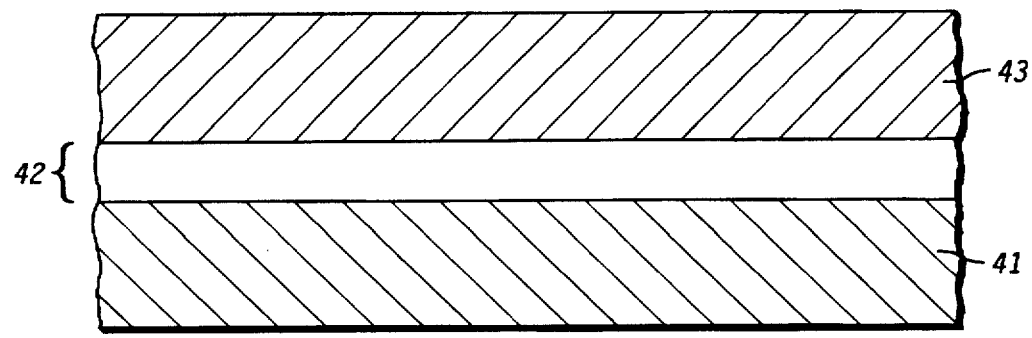
FIG. 3 depicts a partial cross-sectional view of yet another embodiment of an assembly substrate in accordance with the present invention.

Continuing with the following figure, FIG. 3 depicts a partial cross-sectional view of yet another embodiment of an assembly substrate 40. Assembly substrate 40 includes copper layer 43 and underlying aluminum nitride substrate 41, which are similar to layer 13 and substrate 11, respectively, of FIG. 1. Assembly substrate 40 also includes composite layer 42, which is located between aluminum nitride substrate 41 and copper layer 43. Composite layer 42 is comprised of an alloy of partially stabilized zirconia and an oxide such as, for example, alumina. The as-deposited zirconia in composite layer 42 has the aforementioned tetragonal crystal structure.

It is understood that while the embodiment depicted in FIG. 3 can be easier to fabricate than the embodiment illustrated in FIG. 1 because composite layer 42 of FIG. 3 has fewer layers than composite layer 12 of FIG. 1, the embodiment of FIG. 1 provides a more robust toughening mechanism than the embodiment of FIG. 3 because composite layer 42 contains partially stabilized zirconia.

Therefore, in accordance with the present invention, it is apparent there has been provided an improved assembly substrate and its method of making that overcomes the disadvantages of the prior art. The present invention provides an improved interface between an aluminum nitride substrate and an overlying copper film. The present invention also reduces the reliability problems due to stress that are associated with assembly substrates of the prior art.

While the subject invention has been particularly shown and described with reference to preferred embodiments, it will be understood by those skilled in the art that changes in form and detail may be made without departing from the spirit and scope of the invention. For instance, while composite layer 12 is illustrated in FIG. 1 to include three layers of zirconia, composite layer 12 can have less than or greater than three zirconia layers. Accordingly, composite layer 12 can also have less than or greater than four buffer layers. Similarly, composite layer 32 in FIG. 2 can include more than one zirconia layer and more than one buffer layer.

I claim:

1. A semiconductor component comprising:
   a substrate;
   a composite layer overlying the substrate, the composite layer comprising:
      a first layer comprised of a first oxide and contacting the substrate; and
      a second layer having a tetragonal crystal structure and contacting the first layer;
   an electrically conductive layer overlying the second layer; and
   a semiconductor device electrically coupled to the electrically conductive layer.

2. The assembly substrate according to claim 1, wherein the composite layer further comprises:
   a third layer overlying the second layer and having the tetragonal crystal structure; and
   a fourth layer between the second and third layers and comprised of a second oxide.

3. The assembly substrate according to claim 2, wherein the composite layer further comprises a fifth layer located between the third layer and the electrically conductive layer, the fifth layer comprised of a third oxide.

4. The assembly substrate according to claim 2, further comprising an eutectic oxide bond between the electrically conductive layer and the composite layer.

5. The assembly substrate according to claim 2, wherein the second and third layers are comprised of zirconia.

6. The assembly substrate according to claim 2, wherein the second and third layers each have a thickness of approximately 2-13 nanometers.

7. The assembly substrate according to claim 2, wherein the first and fourth layers each have a thickness of approximately 10-100 nanometers.

8. A semiconductor component comprising:
   a substrate;
   a composite layer overlying the substrate and comprised of an alloy of an oxide and a material having a tetragonal crystal structure;
   an electrically conductive layer overlying the composite layer; and a semiconductor device overlying the electrically conductive layer.

9. A semiconductor component comprising:

an aluminum nitride substrate;

a first alumina layer contacting the aluminum nitride substrate;

a first zirconia layer overlying the first alumina layer;

a second alumina layer overlying the first zirconia layer;

a copper layer overlying the second alumina layer; and a semiconductor device electrically coupled to the copper layer.

10. The semiconductor component according to claim 9, wherein the aluminum nitride substrate has a first thickness of approximately 375–625 microns and wherein the copper layer has a second thickness of approximately 175–425 microns.

11. The semiconductor component according to claim 9, wherein the first alumina layer has a first thickness of approximately 10–100 nanometers, wherein the first zirconia layer has a second thickness of approximately 2–13 nanometers, and wherein the second alumina layer has a third thickness of approximately 10–100 nanometers.

12. The semiconductor component according to claim 9, further comprising:

a second zirconia layer overlying the second alumina layer; and a third alumina layer overlying the second zirconia layer and underlying the copper layer.

13. The semiconductor component according to claim 9, wherein the first zirconia layer has a crystal structure selected from the group consisting of a tetragonal crystal structure or a monoclinic crystal structure.

14. A method of making a semiconductor component, the method comprising the steps of:

providing a substrate comprised of aluminum nitride;

depositing an initial layer contacting the substrate and comprised of an oxide;

depositing a first layer contacting the initial layer and comprised of zirconia;

depositing a second layer overlying the first layer and comprised of the oxide;

providing a third layer overlying the second layer and comprised of copper;

providing a semiconductor device electrically coupled to the third layer.

15. The method according to claim 14, wherein the steps of depositing the first and second layers include using a deposition technique selected from the group consisting of sputtering or vapor deposition.

16. The method according to claim 14, wherein the step of depositing the first layer includes forming a tetragonal crystal structure.

17. The method according to claim 14, wherein the step of depositing the first layer includes sputtering 2–13 nanometers of the first layer.

18. The method according to claim 14, wherein the step of depositing the second layer includes sputtering alumina overlying the first layer.

19. The method according to claim 14, further comprising the step of sputtering a fourth layer overlying the substrate before the step of depositing the first layer, the fourth layer comprised of alumina.

20. A semiconductor component comprising:

a substrate;

an adhesion layer contacting the substrate and comprised of titanium nitride;

a composite layer overlying the adhesion layer, the composite layer comprising:

a first layer comprised of a first oxide; and a second layer having a tetragonal crystal structure and contacting the first layer;

an electrically conductive layer overlying the composite layer; and a semiconductor device electrically coupled to the electrically conductive layer.

* * * * *